United States Patent [19]

Davis

[11] 3,742,597

[45] July 3, 1973

[54] METHOD FOR MAKING A COATED PRINTED CIRCUIT BOARD

[75] Inventor: Dana L. Davis, Malden, Mass.

[73] Assignee: Hadco Printed Circuits, Inc., Derry, N.H.

[22] Filed: Mar. 17, 1971

[21] Appl. No.: 125,313

[52] U.S. Cl. .................................. 29/625, 174/68.5

[51] Int. Cl. .......................... B41m 3/08, H05k 3/00

[58] Field of Search ...................... 29/625, 626, 627; 174/68.5

[56] References Cited

UNITED STATES PATENTS

| | | | |
|---|---|---|---|
| 3,568,312 | 3/1971 | Perricone | 29/625 |
| 2,897,409 | 7/1959 | Gitto | 317/101 |
| 3,102,213 | 8/1963 | Bebson et al. | 29/625 |
| 3,090,706 | 5/1963 | Cado | 117/212 |

OTHER PUBLICATIONS

American Welding Society, Terms and Definitions, 1969, page 47.

*Primary Examiner*—Richard J. Herbst
*Assistant Examiner*—C. E. Hall
*Attorney*—Cesari and McKenna

[57] ABSTRACT

A printed circuit board includes a circuit portion and a contact portion. Solder coats copper in and adjacent each of a plurality of holes in the circuit portion. An insulating overlay covers the circuit portion except at the solder-coated portions.

To construct this board, holes are drilled through a copper clad, laminated plastic sheet. Then resist is applied to all portions of the board except adjacent the holes. Two successive plating processes deposit copper and solder to the board at the holes to produce solder-coated pads at each hole and a solder-coated, copper plating through each hole. The next process step includes depositing a second resist to selected areas of both board portions before etching the board to form contacts and circuits. After plating the contacts, the board is finished by applying a plastic resin overlay to the entire circuit portion except at the pad areas.

9 Claims, 5 Drawing Figures

PATENTED JUL 3 1973

3,742,597

SHEET 1 OF 2

INVENTOR
DANA L. DAVIS
BY
Cesari and McKenna
ATTORNEYS

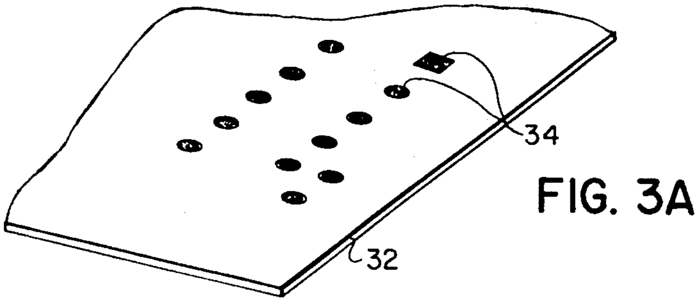
FIG. 3A
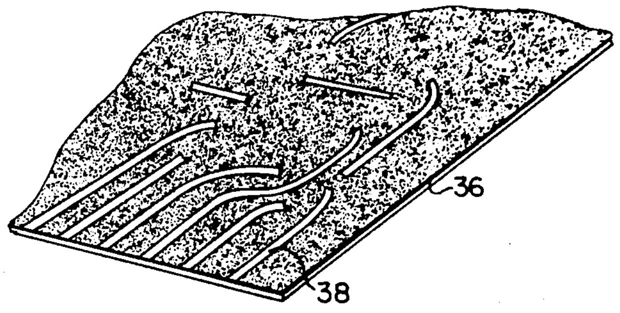
FIG. 3B
STEP
1 PREPARE THREE SCREENS FOR:
1. PAD AREAS
2. ENLARGED PAD AREAS
3. CIRCUIT AND CONTACT AREAS
2 FORM HOLES
3 DEPOSIT COPPER FLASHING
4 DEPOSIT RESIST WITH SCREEN 1
5 COPPER PLATE
6 SOLDER PLATE
7 DEPOSIT RESIST WITH SCREEN 3 AND ETCH
8 PLATE CONTACTS
9 DEPOSIT MASKING MATERIAL WITH SCREEN 2
10 HEAT BOARD TO MELT SOLDER
FIG. 4
INVENTOR
DANA L. DAVIS

METHOD FOR MAKING A COATED PRINTED CIRCUIT BOARD

BACKGROUND OF THE INVENTION

This invention generally relates to electric circuit boards, commonly known as printed circuit boards, and more specifically to improvements in the process for making these printed circuit boards.

The first etched, copper circuit boards comprised a copper foil or layer supported by an insulating substrate. Holes through the boards located components which were soldered to annular foil portions, or pads, surrounding the holes. Thin foil strips, or circuits, connected appropriate pads to each other and to contacts on the edge of the board. Pads, contacts and circuits were formed by selectively etching the copper foil.

Several improvements have been made over the years. One such improvement includes plating copper through each hole in the board. Copper-plated holes provide a solderable surface. The resulting copper-to-component solder bond is significantly more reliable than the prior bonds.

Solder plating is another improvement. Copper oxidation and contamination can damage a circuit board during protracted storage. Specifically, solder does not adhere to an oxidized circuit or pad, so subsequent soldering problems exist. Contamination can actually destroy the foil. While both problems are substantially overcome by coating all the copper surfaces with solder, the coating step does complicate subsequent contact plating manufacturing steps.

Connector blocks usually support printed circuit boards, and fingers in the blocks frictionally engage contacts on the board edge. In order to provide a reliable connection, each contact usually has a precious metal coating (e.g., gold, or rhodium) to reduce contact oxidation and contamination. With solder-coated boards, however, the manufacturing process is complicated because solder on the contacts must be removed before the plating operation.

More recently, attempts have been made to protect printed circuit boards even further by coating the circuit portion with a plastic resin. Such a resin, if applied successfully, would protect the board electrically, mechanically and chemically. As the resin is an electrical and heat insulator, it would prevent dust or other particles or adjacent boards or components from short-circuiting the board and would make the board less susceptible to heat damage. Such a coating over overlay would also reduce damage caused by ripping conductors from the board. The overlay would also reduce the formation of solder bridges between adjacent circuits during subsequent soldering operations.

In accordance with one attempt, an insulating material fills the spaces between the circuits and pads, and then the entire board is ground. This approach tends to protect the board mechanically, but not electrically or chemically.

In a more recent approach, a resin material coats the circuit portion including solder-coated circuits, but not the solder-coated pads. Although this may seem to be a simple solution, it is not. During subsequent component assembly, the soldering operations melt the solder on the circuits. As a result, the solder can spread under the coating and contact adjacent circuits thereby ruining the board.

Still other manufacturing problems exist which are most easily understood by reviewing a typical manufacturing process. The first step in such a process includes forming the holes through a copper clad, plastic laminated sheet, usually by drilling. After applying a copper flash to the entire board, an electroplating resist is placed on the board by a screening or photographic process. The resist covers all portions of the board not corresponding to the final locations of circuits, contacts and pads. Next, the board is electroplated, first with copper and then with solder. When the solder is plated onto the copper, it increases the size of the circuits and pads. As a result, the density or proximity of circuits on the board is limited.

All resist is removed before the board is immersed in a copper etching solution. The solution etches the bare copper, but critical process controls are required to prevent the solution from undercutting the solder and etching the circuits.

As solder coats all the remaining copper, the solder must be stripped from the contacts before plating them. This requires the application of an acid-resistant tape to the board and immersion of the contact portion into a solder stripping solution. Then the contacts are electroplated, and the tape is removed.

When the board is to receive an insulating overlay, the resin material is screened onto the board and heated. As previously indicated, this requires other critical process controls to prevent boiling the solder under the overlay itself.

Therefore, it is an object of this invention to provide a printed circuit board with a resin overlay and a simplified process for making such a board.

It is another object of this invention to provide a printed circuit board which can accommodate circuits at a higher density than was possible in the prior art.

Another object of this invention is to provide a printed circuit board which resists heat damage during subsequent soldering operations.

Yet another object of this invention is to provide a printed circuit board which can be stored for extended time periods.

Another object of this invention is to provide a printed circuit board which facilitates and improves soldering when circuit components are mounted thereon.

Another object of this invention is to provide a simple process for manufacturing a printed circuit board with an insulating overlay.

Still yet another object of this invention is to provide a process for manufacturing printed circuit boards with insulating overlays which minimizes manufacturing costs.

SUMMARY

In accordance with one aspect of my invention, I drill holes in a circuit board and electrolessly deposit a copper flash. Next, I apply a resist to the board through a screen which has opaque portions corresponding to each hole. With this resist pattern, subsequent copper and solder electroplating steps produce solder-coated pads and holes. A second resist is applied to the board through another screen to cover circuit and contact portions before etching the board. After plating the contacts, I apply a plastic resin through another screen which has opaque portions corresponding to the pads and the contact portion and heat-harden the resin. The board is finished by reheating it to melt the plated solder.

As will be apparent, there is no solder on the circuits. Therefore, the subsequent step of heating the mask is not critical because there is no solder to boil under the overlay. Manufacturing expenses are also reduced because less solder is applied to the board and especially because stripping solder from the contacts is eliminated.

During component assembly, the insulating overlay tends to concentrate heat at the pads to improve the soldering characteristics and promote capillary action through the holes. As the overlay covers the circuits themselves, solder bridging problems do not exist.

This invention is pointed out with particularity in the appended claims.

The above and further objects and advantages of this invention can be attained and more fully appreciated by referring to the following description taken in conjunction with the accompanying drawings.

BRIEF DESCRIPTION OF THE DRAWINGS

FIG. 3 illustrates typical screens used in one process for implementing my invention; and FIG. 4 is a flow diagram of a process used to construct a printed circuit board incorporating this invention.

DESCRIPTION OF AN ILLUSTRATIVE EMBODIMENT

Figure 1:
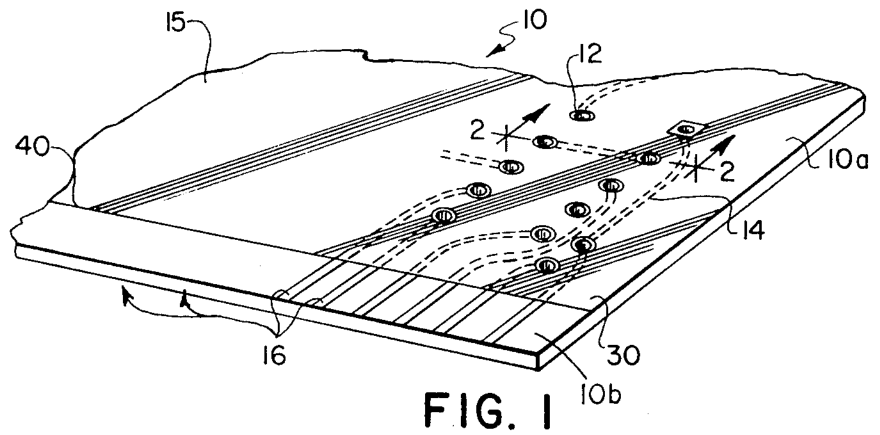
FIG. 1 is a perspective view of a portion of a printed circuit board formed in accordance with my invention.

In FIG. 1 a circuit board 10 constructed in accordance with this invention comprises pads 12 and circuits 14 at a circuit portion 10*a*. The circuits 14 are under an insulating overlay 15. Contacts 16, in a contact portion 10b, are disposed in parallel and are adapted to engage fingers in a conventional connector block.

Figure 2:
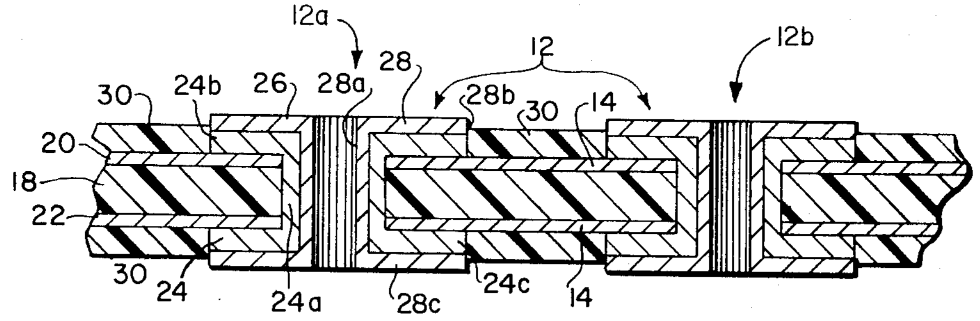
FIG. 2 is a sectional view taken along lines 2—2 in FIG. 1.

FIG. 2 provides additional detail of the circuit board. The laminated circuit board 10 initially comprises a paper or glass base plastic sheet 18 between two copper layers or foils 20 and 22. The resulting assembly is a conventional copper-clad laminated plastic sheet. Most boards include a 0.0014 inch of copper foil although foils from 0.0007 inch to 0.007 inch are common.

FIG. 2 shows two pads 12*a* and 12*b* in detail. Referring specifically to the pad 12*a*, an additional annular copper coating 24 overlays portions of the copper foils 20 and 22 surrounding each hole; the coating also extends through each hole. This additional copper coating 24 usually is thicker than 0.001 inch so at least that amount coats the cylindrical surfaces (i.e., the portions 24*a*). As portions 24*b* and 24*c* are deposited on foils 20 and 22, each pad has at least 0.0017 inch of copper on the substrate 18, and normally 0.0024 inch.

Solder 26 coats all the electroplated copper 24 to a thickness of at least 0.0003 inch with 0.0005 inch being common. The minimum thickness is that which resists the etching fluid. Any solder can be used, although 60/40 tin/lead solder is normally used.

Still referring to FIG. 2, only the pads 12*a* and 12*b* (including the copper portion 24*a*) have solder coatings. While the circuits 14 are not coated with solder, the entire circuit portion (10*a* in FIG. 1) has an insulating overlay 30 except at the pads 12. Many overlay materials are available. Certain materials are desirable because they resist chemical combination; others provide good mechanical protection. Still others can withstand subsequent soldering during component assembly operations. Both the material and the process for applying it determine the final overlay thickness.

Contacts 16 in FIG. 1 are conventional and comprise a nickel base plated on the foil and an outer layer of a precious metal which resists oxidation and contamination, such as gold or rhodium. The nickel layer is usually from 0.0003 inch to 0.0005 inch thick. Gold may be plated from 50 to 150 millionths of an inch while rhodium is usually plated to less than 0.0001 inch.

The resulting printed circuit board has several advantages. First, the solder and overlay increase shelf life significantly. Shelf life is the time a board may be stored without damage from oxidation or contamination. Any problems caused by solder oxidation are self-correcting. Subsequent soldering during component assembly operations (1) melts the solder so the oxides form a dross and (2) sweeps the dross from the solder.

The overlay 30 is a good heat insulator. As a result, heat transferred to the board during component soldering operations tends to concentrate at the pads 12. This improves the soldering characteristics by promoting capillary action through the holes and preventing or tending to reduce any board or component overheating, especially at the circuits 14 which are considerably thinner than the pads 12.

As the circuits 14 consist of copper only, very close spacing can be obtained. No solder bridging problems exist because the solder never contacts the circuits 14 during component assembly.

Now referring to FIGS. 3 and 4, it is possible to discuss a screening process for forming a printed circuit board in accordance with another aspect of my invention. In a screening process, the first process step is preparing three screens which correspond to the final circuit, pad and contact locations. A portion 32 of a first screen is shown in FIG. 3A. Spattered portions 34 represent opaque areas which do not pass the resist material. In this screen, spattered portions 34 correspond to the holes through the board.

A second screen, similar to that shown in FIG. 3A, is also prepared. The only differences are that opaque areas corresponding portions 34 are enlarged and that the transparent areas correspond with the circuit portion 14 only. The enlargement is not significant, usually being in the order of 5 mils for a given diameter.

FIG. 3B shows a portion at a third screen 36 where spattered portions also represent opaque areas. As can be seen by comparing FIG. 3B to FIG. 1, transparent portions 38 correspond to the circuits 14 and contacts 16 (FIG. 1) only.

The second step of the process shown in FIG. 4 is that of forming holes through the copper-clad boards. Normally, this is performed by a conventional drilling operation. Then copper flashing is deposited on the board by an electroless process. The flash is also deposited on the surfaces of the insulating board 18 (FIG. 2) defining the holes during this operation. Now the screen shown in FIG. 3A is registered with the board.

After applying an electroplating resist to the board through the screen 32 (FIG. 3A), a conventional electroplating operation deposits additional copper (usually more than 1 mil) at the pads and through the holes.

Then the exposed copper portions are cleaned before a succeeding electroplating process deposits over 0.3 mils of solder 26 onto the pads 12 and through the holes. No other solder plates the board because the electroplating resist is still on the board. As a result, the amount of solder used in the process is reduced significantly. After the plating process is completed, the board is cleaned completely. This includes removing the electroplating resist.

Now the board can be etched. First, the screen 36 (FIG. 3B) is registered with the printed circuit board. Then the etching resist is applied through the transparent portions 38, which correspond to the circuits 14 and contacts 16. The board is immersed in a conventional etching solution. As known, all copper portions not coated with solder 26 or the resist are eaten away from the board. However, the copper etching solution cannot attack the circuit pads or contacts. Two additional manufacturing advantages result at this point. First, the prior process controls are eliminated because the danger of the etching fluid undercutting the circuits 14 is substantially eliminated. The only place where undercutting could occur is at the pads 12. However, the added copper at the pads 12 makes any etching insignificant. Secondly, no resist is applied to the pads 12. Therefore, the holes stay relatively clean, so subsequent cleaning operations are minimized.

Still another object now becomes more apparent in reviewing the contact plating process. As will be remembered, contacts made in prior processes had a solder coating which had to be removed. These removal steps, including taping and acid cleaning are eliminated. In accordance with my invention, the contacts never have solder on them. Hence, it is merely necessary to locate tape on the circuit portion **10*a* (FIG. 1) abutting a line 40 to define the contact portion 10*b*.** After the contacts are plated conventionally, the tape is removed.

Now the overlay is formed. The second screen, described as being similar to that shown in FIG. 3A, is initially registered with the board; and the overlay material is screened onto the board and heat treated. Normally, the overlay material is a permanent, heat hardenable, epoxy-base resin. Such resins are commercially available and well known in the art.

As the opaque portions in the second screen are larger than those in the first screen, the overlay 30 and solder 24 at the pads 12 are not contiguous. Furthermore, electroplated solder has a crystalline structure which does not solder well. Therefore, it is highly desirable to melt the solder, as by immersing the board in a hot liquid wax solution. This step alters the solder structure to improve its flow characteristics during subsequent component assembly operations. It also spreads the molten solder into intimate contact with the overlay 30 to assure that all copper on the board is completely covered.

In summary, my process provides several advantages. The manufacturing expenses are reduced, especially those associated with solder plating. As described, steps for plating the contacts are simplified significantly. Furthermore, the process is simplified and fewer process controls are necessary.

It will be obvious that many modifications can be made to this specific embodiment of the process. For example, I have elected to describe my process in terms of screening the resist onto the board. Photographic processes are also applicable. In that case, reverse images of the screens shown in FIGS. 3A and 3B would be used to remove resist from areas corresponding to the pads and circuits.

Variations in the process are also possible. For example, in some situations, it is desirable to plate the entire board immediately after the drilling operation. This is known as panel plating. After plating the copper, the electroplating resist is applied before electroplating the solder. Another variation includes applying the overlay before plating the contacts. This variation is especially adapted for use where there are no holes in the contact portion.

It will also be apparent I have described my invention in terms of a conventional copper etching. However, it may also be adapted for processes in which copper is deposited on an insulating substrate. With this process, I would drill the board and screen the resist onto the board through a single screen with transparent portions corresponding to the circuits, pads and contacts. Then the board would be copper plated and cleaned. A second resist would be applied through a screen analogous to that shown in FIG. 3A before plating the pads and holes with solder. Then the board would be cleaned, the contacts plated and the overlay deposited as previously described.

Therefore, it is the object of the appended claims to cover all such variations and modifications as come within the true spirit and scope of this invention.

What I claim as new and desire to secure by Letters Patent of the United States is:

1. A process for making a printed circuit board comprising the following steps, performed in the order hereafter recited:

A. providing an insulating substrate clad on at least one side with a conductive foil and having holes extending through said substrate and said foil;

B. selectively plating solder onto the clad substrate so that substantially only the walls of said holes and regions of said foil immediately adjacent said holes are solder coated;

C. then selectively etching said foil to form conductors extending from said regions, at least one of said conductors terminating in a contact finger portion, said etching not affecting said solder or said regions of said foil; and D. forming an insulating overlay on the entire surface of said clad substrate except on the solder coated areas and said contact finger portion.

2. A process as recited in claim 1 wherein said solder plating step includes:

A. depositing resist on said foil at all areas except areas corresponding to said regions, and B. plating copper on the walls of said holes and in said regions, said solder being plated onto the plated copper.

3. A process as recited in claim 2 wherein said copper and solder plating steps include electroplating and the resist is an electroplating resist.

4. A process as recited in claim 1 wherein said solder plating step uses screening steps comprising:

A. forming a first screen with opaque portions corresponding to said regions,

B. forming a copper flash on all exposed board surfaces,

C. depositing an electroplating resist onto the board through the first screen after the first screen and board are in registration, D. electroplating copper onto said foil and the walls of the holes, and E. electroplating solder onto the plated copper surfaces.

5. A process as recited in claim 1 wherein said overlay forming step comprises

A. depositing a heat-hardenable plastic epoxy resin into selected portions of the board, and B. heat hardening the plastic.

6. A process as recited in claim 4 wherein said overlay forming step includes the steps of A. forming a second screen with opaque portions corresponding to said regions, B. depositing a heat hardenable plastic epoxy resin through the second screen to selected portions of the board, and C. heat hardening the resin.

7. A process as recited in claim 1 additionally comprising the step of heating the board to the solder melting temperature after forming the overlay.

8. A process as recited in claim 1 additionally comprising the step of plating copper onto the board adjacent to and through the holes, said copper plating step preceding said solder plating step.

9. A process as recited in claim 8 wherein said copper plating step includes

A. electrolessly depositing a copper flash on said board,

B. depositing an electroplating resist to said board except at areas adjacent and through said holes, and C. electroplating copper onto exposed areas of said board.

* * * * *

PO-1050
(5/69)

UNITED STATES PATENT OFFICE
CERTIFICATE OF CORRECTION

Patent No. 3,742,597 Dated July 3, 1973

Inventor(s) Dana L. Davis

It is certified that error appears in the above-identified patent and that said Letters Patent are hereby corrected as shown below:

Column 1, line 37, after "gold" delete the comma ","
line 50, delete "over" and insert --or--
Column 2, delete lines 34 through 47.

Signed and sealed this 11th day of June 1974.

(SEAL)
Attest:

EDWARD M.FLETCHER,JR.
Attesting Officer

C. MARSHALL DANN
Commissioner of Patents